US008277905B2

(12) United States Patent
Mennig et al.

(10) Patent No.: US 8,277,905 B2
(45) Date of Patent: Oct. 2, 2012

(54) METHOD FOR PRODUCING DEFECT-FREE LIGHT GUIDING ELEMENTS OF GREAT WIDTHS, PRODUCTION DEVICE AND DIFFRACTIVE LIGHT GUIDING ELEMENT

(75) Inventors: Martin Mennig, Fischbach (DE); Peter Oliveira, Saarbruecken (DE)

(73) Assignee: EPG (Engineered Nanoproducts Germany) AG, Griesheim (DE)

( * ) Notice: Subject to any disclaimer, the term of this patent is extended or adjusted under 35 U.S.C. 154(b) by 909 days.

(21) Appl. No.: 12/224,989

(22) PCT Filed: Mar. 14, 2007

(86) PCT No.: PCT/EP2007/002263
§ 371 (c)(1),
(2), (4) Date: Dec. 9, 2008

(87) PCT Pub. No.: WO2007/104555
PCT Pub. Date: Sep. 20, 2007

(65) Prior Publication Data
US 2009/0091833 A1    Apr. 9, 2009

(30) Foreign Application Priority Data

Mar. 15, 2006    (DE) .................. 10 2006 011 949

(51) Int. Cl.
  *B05D 3/06* (2006.01)
  *B05D 5/06* (2006.01)
(52) U.S. Cl. ..................... 427/553; 427/163.2
(58) Field of Classification Search .............. 427/163.2, 427/553
See application file for complete search history.

(56) References Cited

U.S. PATENT DOCUMENTS

| | | | |
|---|---|---|---|
| 4,415,509 A | 11/1983 | Toyooka et al. | |
| 5,529,473 A | 6/1996 | Lawton et al. | |
| 5,552,261 A | 9/1996 | Kraska et al. | |
| 6,007,888 A | 12/1999 | Kime | |
| 7,390,532 B2 | 6/2008 | Dellwo et al. | |
| 7,473,721 B2 | 1/2009 | Harada et al. | |
| 2002/0051866 A1* | 5/2002 | Mullen | 428/156 |
| 2003/0082482 A1* | 5/2003 | Wada et al. | 430/273.1 |
| 2004/0067323 A1 | 4/2004 | Clabburn et al. | |
| 2004/0188874 A1* | 9/2004 | Hikita et al. | 264/1.34 |
| 2004/0219457 A1 | 11/2004 | Clabburn et al. | |
| 2005/0059760 A1* | 3/2005 | Dellwo et al. | 524/409 |
| 2008/0081264 A1 | 4/2008 | Mennig et al. | |
| 2008/0247009 A1 | 10/2008 | Mennig et al. | |

FOREIGN PATENT DOCUMENTS

| | | |
|---|---|---|
| DE | 102 00 760 | 7/2003 |
| EP | 1 407 897 | 4/2004 |
| WO | 99/58327 | 11/1999 |
| WO | 02/39185 | 5/2002 |
| WO | 03/058292 | 7/2003 |
| WO | 2006/066856 | 6/2006 |
| WO | 2006/066858 | 6/2006 |

OTHER PUBLICATIONS

Machine Translation of EP 1407897 Apr. 2004.*
English language abstract of EP 1 407 897.

* cited by examiner

*Primary Examiner* — Leo B Tentoni
(74) *Attorney, Agent, or Firm* — Abel Law Group LLP

(57) ABSTRACT

A process for producing a diffractive light guiding element by a continuous, single-stage reel-to-reel method, an apparatus suitable for carrying out the process and a light guiding element obtainable by the process.

23 Claims, 1 Drawing Sheet

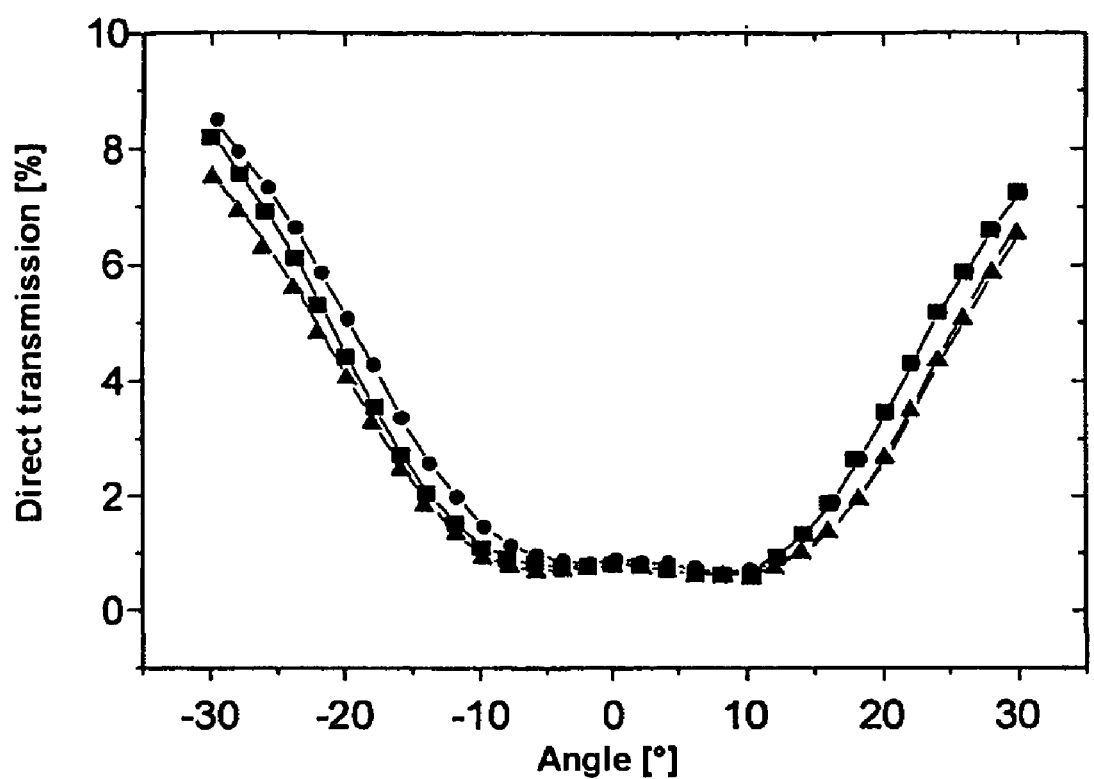

METHOD FOR PRODUCING DEFECT-FREE LIGHT GUIDING ELEMENTS OF GREAT WIDTHS, PRODUCTION DEVICE AND DIFFRACTIVE LIGHT GUIDING ELEMENT

BACKGROUND OF THE INVENTION

1. Field of the Invention

The invention relates to a process for producing diffractive light guide elements, to an apparatus for producing the diffractive light guide elements and to the light guide elements thus obtainable.

2. Discussion of Background Information

Light guide elements are also referred to as diffusers. Light guide elements and diffusers are understood to mean elements, especially films, with light-guiding properties. The simplest form of diffusers is that of diffusing screens which have a scattering action but do not permit directed guiding. However, the achievement of directed light guiding is of high significance for many optical applications, since many different effects can thus be achieved, for example an increase in the light yield in the case of displays, adjustment of the scatter and viewing angle of displays, side light-independent reflection for daylight projection, increase of contrast and others.

For the development of light guide properties, a refractive index gradient is generated. The principle of generating a refractive index gradient is known. As described, for example, in U.S. Pat. Nos. 5,552,261 and 5,529,473, the diffusion of monomers with a refractive index increased or else reduced relative to the surrounding liquid matrix can be utilized for the generation of a refractive index gradient. The "Colburn-Haines effect" known in photopolymers for directed diffusion with subsequent polymerization in the regions exposed in patterns leads to an increase in the density and hence to an increase or reduction in the refractive index. Thereafter, the refractive index gradient profile is fixed by whole surface curing (full-area curing). Instead of simple organic monomers, photosensitive components of inorganic nature have subsequently also been used, with which a greater difference in refractive index was achievable.

The production of such light guide elements is likewise known in principle, for instance by holographic processes. Light guide elements can be produced, for example, by embossing surface structures with light-guiding action or by pointwise exposure (for example with perforated masks) of photosensitive polymer films (photopolymers).

For example, WO 03/058292 describes processes for producing optical elements with gradient structure, in which nanoscale particles embedded in a solid matrix are obtained by generating a potential difference in a nanocomposite material composed of a curable matrix material with particles dispersed therein, such that directed diffusion of the nanoscale particles proceeds with formation of the concentration gradient, and the nanocomposite material having the concentration gradient cures. The nanocomposite material may be a photosensitive material.

DE-A-10200760 describes a process for producing a refractive index gradient film, in which a refractive index gradient is generated in a polymerizable, solid or gel-form nanocomposite material, for example by lithography or local exposure, and is then fixed by curing.

Patent applications PCT/EP2005/013685 and PCT/EP2005/013683 to the applicant describe processes for producing optical components with refractive index gradients, in which the refractive index gradient is generated in a hybrid material, said hybrid material comprising a soluble organic polymer and a mono- or polynuclear metal complex with photopolymerizable or thermally polymerizable ligands. Local irradiation or heating of the hybrid material forms the concentration gradient, which is then fixed by curing.

According to the above prior art, the light guide elements are produced by a two-stage process. In DE-A-10200760, for example, a photosensitive composition is applied to a backing by customary coating methods and dried. When polymer films are used as backings, the composite formed is provided with a cover film for protection and wound up for storage. In a second stage, the photosensitive composition applied is then structured, for which the cover film usually has to be removed.

The disadvantages of these two-stage processes arise from the necessity of drying only under very mild conditions after the coating, since the diffusion of the more highly refractive monomers or of the nanoparticles is very limited in more highly consolidated layers and the formation of a structure, such as a holographic structure, becomes virtually impossible in the subsequent pattern exposure process. This in turn causes a very great mechanical sensitivity of the layer applied and the tendency to stick to the mask. Both effects cause very high defect rates in the diffuser layers, which are not tolerable for many applications. An additional factor is that each process step, for example rolling up and unrolling again and accompanying transport processes, increases the error rate further. Moreover, current technology is restricted to film widths of no more than 60 cm. Specifically, the following disadvantages in particular arise in the state of the art:

1. The sandwich produced in the first process step is very soft and free-flowing and very sensitive to mechanical stress as a result of the process. As a result of the repeated handling, there is inevitably mechanical stress and these mechanical stresses can lead to minimal deformations in the surface, which are optically significantly amplified by the subsequent second step (exposure). This is caused by the fact that, in the course of exposure, so-called "light pipes" form along the direction of irradiation. Thus, if unevenness, such as small dents, bumps, bulges or scratches, is present in the sandwich to be exposed, which are referred to hereinafter as microdefects, the photosensitive material is irradiated at very different angles in the vicinity of these microdefects, which leads to macroscopically visible disruption of the parallelism of the light pipes and hence to macroscopically clearly visible disruption in the visual appearance and in the visual effect of the overall diffuser. Such diffusers are unsuitable in particular for use in the display sector.

2. The two-stage process requires storage times between the first and the second process step. During this storage, there may be aging processes in the light-sensitive material, which prevent reproducible diffuser production. Moreover, the storage of the sandwich material in the wound state, as a result of different pressures in the interior and exterior of the sandwich roll and as a result of the influence of gravity, leads to periodic occurrence of layer thickness variations which lead to clearly visible periodic variations in the optical effect of the diffuser film produced therefrom, since the light pipe structure comprises volume phase holograms whose effect (diffraction efficiency) depends greatly on the thickness. These too are macroscopic defects which are an obstacle to use of the diffusers, especially in the display sector.

3. For large-size applications of diffusers, for example in projection screens or large-size LCD-TV displays, it is necessary to join two or more diffuser films in longitudinal direction such that no seam is visible. This is because the width of the optics required for the exposure cannot be scaled up as desired for technical reasons and also for reasons of cost, for example cannot be scaled up to 1.60 m. The seamless joining of two or more diffusers produced in the above-described two-stage process by different processes known in the prior art is, though, not possible in the quality required for the abovementioned applications.

4. The two-stage process is very expensive owing to the numerous process steps.

5. When widths of above 50 to 60 cm are employed, owing to the fundamentally unavoidable inhomogeneities in relation to exposure and drying or temperature programming, warpage with corrugated or nonplanar edges occurs. These regions cannot be utilized for the above-described possible applications. Larger areas are possible only by joining smaller parts. Although this problem can be reduced to a certain degree by the mounting of oblique running wheels on the film edge, it is not possible overall according to the state of the art with the two-stage process to achieve greater widths.

It was therefore an object of the present invention to provide a process with which the above-described macroscopic defects of light guide elements can be avoided and which allows production of diffusers with high width which significantly exceeds the width of available exposure optics.

It has now been found that, surprisingly, this object is achieved by a process for producing diffractive light guide elements with a continuous roll-to-roll process.

The diffractive light guide elements comprise optical and microoptical light guide elements.

SUMMARY OF THE INVENTION

The invention therefore relates to a process for producing a diffractive light guide element, which comprises the following steps:

a) applying a photosensitive coating composition to a flexible backing web,
b) drying the coating composition applied,
c) laminating a flexible mask onto the dried coating composition,
d) exposing the coating composition through the mask, in order to obtain a refractive index gradient in the coating composition through the pattern exposure,
e) whole surface curing the coating composition in order to fix the refractive index gradient, steps a) to e) being performed in this sequence in a continuous, one-stage roll-to-roll process.

For the process according to the invention, a continuous, combined coating and exposure plant was newly constructed. The invention therefore further relates to an apparatus with which the process according to the invention can be performed, i.e. to an apparatus for producing a diffractive light guide element in a continuous, one-stage roll-to-roll process, comprising a) an application device for applying a photosensitive coating composition to a flexible backing web,
b) a drying device for drying the coating composition applied,
c) a lamination device for laminating a flexible mask onto the dried coating composition,
d) an exposure device for exposing the dried coating composition through the mask,
e) a curing device for whole surface curing of the coating composition, the devices being designed such that a backing web can be transported continuously to devices a) to e) in this sequence to perform the particular process step.

BRIEF DESCRIPTION OF THE DRAWINGS

The figure shows the transmission as a function of the angle measured at three different positions for an inventive optical light guide element.

DETAILED DESCRIPTION OF THE INVENTION

In contrast to the prior art, according to the invention, once a mask has been continuously applied by lamination, the exposure process of the sandwich is carried out "inline" after the predrying process. After the exposure, the mask can be removed immediately thereafter, continuously and again inline. As a result, the entire process can be carried out within an encased coating, lamination and exposure plant under cleanroom conditions. The process according to the invention makes many handling operations superfluous, such as winding and unwinding processes or transport processes, which had been necessary to date according to the prior art and were sources of defects in the optical element to be produced.

Although this reduces causes of defects, such as winding and unwinding and transport, there remains an adhesion problem, which arises through the lamination and the preferred subsequent delamination of the mask. In spite of this problem, it has now been found that, surprisingly, the number of defects is almost two orders of magnitude smaller than in the prior art processes. After the delamination, the delaminated (mask-free) film can, in accordance with the invention, be cured fully without any problem, such that it becomes mechanically insensitive. Overall, the novel process is notable for exceptionally high freedom from defects.

To prevent corrugated edges in the curing/drying, the apparatus may comprise oblique running rolls which are known from the prior art, pull in the outward direction and act on the backing web. They ensure tension on the still-soft film in the outward direction. With this arrangement, it is now surprisingly possible to manufacture virtually any desired film width without the phenomenon of corrugation occurring. It is thus immediately possible to achieve microoptical light guide elements with widths of 1.60 m and more.

The production process of the invention is a continuous, one-stage roll-to-roll process. The roll-to-roll process is a generally customary technique known to those skilled in the art, in which a flexible material such as a film is unwound from one roll and transported to another roll on which it is wound up again, the material being subjected to one or more treatment steps while it is being transported to the second roll. In particular, steps a) to e) are performed in one stage on the flexible material, without it being rolled up again on an intermediate roll in the meantime or, if appropriate, being stored.

The production of the diffractive light guide element is carried out continuously. This is also surprising in that the production of the light guide element comprises different process steps, such as a coating step and a pattern exposure step, which are subject to quite different conditions. Thus, the different treatment steps had a different time requirement in the customary practice.

Useful flexible backing webs may be all materials suitable for this purpose. The flexible backing web is preferably a customary backing film. The backing web or backing film used may, according to the intended use of light guide element, be webs or films with permanent or temporary adhesion to the light guide element to be produced. In the case of temporary adhesion, the backing web is then removed, such that a flexible web or film of the light guide element can be obtained without a backing web. Of course, the backing webs may have a customary pretreatment, for example an antiblocking treatment or a corona treatment.

The backing webs may be transparent or nontransparent. Examples of backing webs are plastic sheets, for example of polyethylene, polypropylene, polycarbonate, polyester and triacetate, preferably of polyester, such as polyethylene terephthalate (PET), or triacetate (TAC), metal foils or metallized films. A typical commercial product is, for example, Melinex® film, a polyester sheet. The backing web is disposed especially on a roll from which it is unwound to perform the process.

In the first step, a photosensitive coating composition, which is preferably liquid, is applied to the flexible backing web. In the inventive apparatus, an application device is provided therefor in the first part of the plant. A suitable flexible backing web is coated there with the photosensitive material. The coating processes utilized may be all processes known from the prior art, for example roll application. Particularly suitable processes are those which enable a slow advance rate, for example spiral coating or knifecoating, or else casting processes such as film casting or coating with a slot die (slot coating). The coating process is suitable with preference for the provision of the desired dry layer thickness. The application rate is selected such that the desired dry layer thickness of the coating composition is achieved. The dry layer thickness can vary within wide ranges; it is generally, for example, 10 to 250 μm, preferably 10 to 150 μm and more preferably 40 to 75 μm.

Thereafter, the coating composition applied is dried. The drying is generally effected to such an extent that the flexible mask can be applied by lamination. The drying can be carried out by all methods known to those skilled in the art, for example by heating and/or with a gas stream. Preference is given to drying by heating. In the course of drying, the solvent in the coating composition is removed completely or partly, for example to a residual content of from 0 to 20% by weight. The apparatus comprises a drying device for the drying, which preferably consists of an oven. Drying conditions, such as temperature and time, depend on one another, on the coating composition used and on the desired degree of drying, which can be selected by the person skilled in the art on the basis of the invention in an appropriate manner.

Downstream of the coating station, the coated backing web therefore preferably passes through an oven in which the solvent present in the photosensitive material is removed completely or partly. The length of the oven is guided by the evaporation rate of this solvent and the web speed required for the exposure (step d)). It is generally in the range between 1 and 10 m, preferably in the range between 1.5 and 5 m and more preferably between 2 and 4 m.

Thereafter, for the mask exposure process, the flexible mask is applied by lamination by methods known from the prior art. Mask exposure processes and masks usable for this purpose are known. The masks used may be all suitable customary masks whose microstructure is suitable for the generation of the light guide element with the required optical properties. Typical examples are commercial photomasks or perforated masks. Also suitable are masks in which particles which are opaque with regard to the wavelength of the exposure to be effected form the structure in a transparent matrix, for example a transparent polymer. The structure arises through the homogeneous distribution of the particles in the matrix and can be varied, for example, through the suitable selection of the concentration of the particles in the matrix, of their shape and of their size according to the desired structure.

According to common practice in mask exposure methods for microoptical systems, the mask has regions which are transparent to the light used in step d) and regions which are opaque to the light used in step d). The transparent regions and the opaque regions form a suitable pattern according to the desired diffractive or microoptical structure in the element to be produced. The person skilled in the art can directly select the mask suitable for the particular purpose. It is preferred that the flexible mask is detached again from the coating composition, i.e. the mask can be applied by lamination reversibly.

The flexible mask is preferably a mask film. In a preferred embodiment, the mask comprises a backing film to which a mask film has been applied, which provides the structuring, i.e. the transparent and opaque regions, and constitutes the actual mask. The film may be a detachable or undetachable layer on the backing film. Together with the backing film, the film may form a film composite of the backing film and of a mask film.

The mask can be wound up onto a roll and unwound for lamination. Suitable techniques for lamination are all of those known to those skilled in the art. It is possible, for example, to use an embossing calender. When a flexible mask which comprises a backing film is used, the backing film of the mask film is preferably removed next by means of a suitable delamination station, in order to achieve the maximum optical quality. In this way, a sandwich is obtained, which comprises the backing web, the coating composition applied thereto and the mask, the backing film optionally having been removed from the mask.

In the next step, the coating composition is exposed through the mask. This accomplishes pattern exposure of the photosensitive coating composition. In this way, a refractive index gradient is obtained in the coating composition, as explained later. For this purpose, the inventive apparatus comprises a suitable exposure device.

For the exposure, all suitable light sources can be used. Their selection is guided by the photosensitive material, for example by any photoinitiators and sensitizers present therein. The exposure can be effected at right angles or at a particular angle of inclination relative to the backing web plane. It is possible for a plurality of light sources with appropriate optics to be connected in series, in which case their angles of inclination may be the same or else different. It is possible to use, for example, laser light, UV light or visible light, preference being given to UV radiation. Preference is given to exposure with parallel light.

The exposure can be carried out at room temperature (23° C.). In a preferred embodiment, the sandwich is subjected to a thermal treatment in the course of pattern exposure, for example above 35° C. An example of a device suitable for the heating is a heating table. The sandwich obtained after step c), from which the backing film of the mask may have been removed, can appropriately be exposed over a table, preferably a heatable table. The temperature used in the pattern exposure depends in turn on the optical properties to be achieved, taking account of the fact that the establishment of the refractive index gradient profile is diffusion-controlled, and on the thermal stability of the materials used, such as backing web, photosensitive material and mask material. Preference is given to temperatures from room temperature to 120° C. and more preferably from 60 to 80° C.

For planarization of the sandwich on the heating table, it is appropriate, as described above, to use stretching rolls or tension rolls at the edge. For the purpose of having an additional means of equalizing tensions in the material, an additional heat treatment process can be inserted downstream of the exposure. Such processes are known from polymer and glass technology; a temperature close to the particular transformation range of the materials in question is selected, in the present case, for example, at temperatures of from 60° C. to 90° C. The pattern exposure allows so-called light pipes to be formed.

Thereafter, preference is given to detaching the flexible mask by a method known to those skilled in the art from the pattern-exposed coating composition and, if appropriate, to winding it up. The mask can also be pulled off after the completion of curing, but still in the roll-to-roll process, i.e. before the light guide element produced is wound onto the roll.

In the next process step, the pattern-exposed coating composition is cured over the full area. This can be done by exposure or thermal treatment, preference being given to whole-area curing by exposure. In the case of whole-area curing by heating, the mask is not disruptive; in the case of exposure, this can be done, for example, from the back of the sandwich if the backing web is transparent to the light used, and so this can also be carried out in the presence of the mask. As stated, the detachment of the mask before the whole-area curing is, though, preferred. Maintaining it may be appropriate, for example, in order that the mask serves as a protective film in the later winding of the finished diffractive element.

The curing over the full area fixes the refractive index gradient formed in step d). In the case of the preferred curing by exposure, the sandwich can be cured over the whole area by flood exposure with or without a mask and hence the refractive index gradient structure generated by the mask exposure can be fixed. For the complete curing, it is also possible to use, for example, laser light, UV light or visible light. The wavelength of the light used for this purpose may correspond to the light used to generate the refractive index gradient structure or be different therefrom. This is guided in turn by the type and number of photoinitiators or sensitizers present in the photosensitive material. In the case of transparent backing films, the flood exposure can be done from the bottom (through the backing film) or else from the top, especially in the case of nontransparent backing films.

For the winding of the diffractive light guide element thus produced, a suitable separation film can be used as an intermediate layer which is applied to the element. This step can be dispensed with if the mask has not been removed after the exposure. Such a separation film or protective film can, if required, be removed again at a later time in the further processing of the light guide element.

The principle of producing refractive index gradients by use of photosensitive coating compositions is known as has been explained above and is explained in detail in the prior art. In the process according to the invention, the photosensitive coating compositions used may be the customary compositions from the prior art. The coating composition comprises especially a photopolymerizable component in a curable matrix material whose refractive index differs from that of the photopolymerizable component and of the photopolymerized component. The photopolymerizable component is generally a component with higher refractive index than the matrix materials, for which especially components of inorganic nature are suitable; preference is given to Ti-, Zr-, Nb- or Ta-containing components. The photopolymerizable component is polymerized in the course of pattern exposure, resulting in the directed diffusion explained above. This generates a concentration gradient and hence a refractive index gradient in the matrix, which is fixed in the subsequent curing.

Suitable photopolymerizable components are those used in the prior art, for example mono- or polynuclear metal complexes with a ligand with a photochemically polymerizable group, or nanoscale particles with surface groups with a photochemically polymerizable group, for example having a mean particle size of from 2 to 200 nm. The ligands or surface groups are generally of organic nature, such that inorganic photosensitive components also comprise organic constituents. The photopolymerizable groups may be all of those known to those skilled in the art, for example reactive double bonds such as vinyl or (meth)acryloyl.

Suitable matrix materials are the materials used in the prior art, for example organic polymers, oligomers or monomers and/or optionally organically modified inorganic condensates, for example condensates formed from hydrolysable silanes. The matrix material can be cured under the conditions of step e). The coating composition may further comprise, as well as solvent, suitable additives, for example plasticizers, thermal or photochemical polymerization or crosslinking initiators (thermo- or photoinitiators), sensitizers, wetting aids, adhesion aids, antioxidants, leveling agents, stabilizers, dyes, photochromic and thermochromic compounds. Sensitizers or photoinitiators can serve to vary or to broaden the wavelength range of light suitable for the photopolymerization. Further details of the usable components of the coating compositions can be found, for example, in the above-discussed applications WO 03/058292, DE-A-10200760, PCT/EP2005/013685 and PCT/EP2005/013683, which are incorporated by reference here.

A photosensitive coating composition means that it is sensitive to the irradiation used in the exposure steps of the invention and enters into curing or polymerization reactions on exposure. The coating composition is preferably liquid for the application. After drying, it is then preferably viscous, in gel form or solid.

The pattern exposure accomplishes the structuring through the diffusion of the photopolymerizable component which is fixed in the through-radiated regions, i.e. those not covered by the mask, and hence forms zones of higher refractive index. The elevated refractive index generally arises from the fact that the photopolymerizable or the photopolymerized component is of inorganic nature and generally has a significantly increased refractive index compared to the polymer matrix.

The structure of the resulting refractive index gradient is arbitrary and can be selected according to the desired application. It is possible to form any desired two- or three-dimensional patterns from regions with relatively high refractive index and regions of relatively low refractive index. It may, for example, be a holographic profile. It is possible to obtain lateral, columnar refractive index gradient structures with preferably stochastically distributed lateral size distribution in the sub-μm up to the lower μm range, so-called light pipes. These light pipes are, for example, aligned parallel to one another and are at right angles (symmetrical diffuser) or at a particular angle (asymmetric diffuser) to the film plane. In particular cases, two or more groups of light pipes can be obtained, which are arranged at different angles (including 90°) to the film plane.

It is possible by the process according to the invention to produce microoptical light guide elements with high width compared to the prior art, which are required, for example, for large-area display applications, for example projection screens, projection TV or LCD-TV.

In the two-stage production process according to the prior art, the maximum obtainable width is limited by the width of the illumination field used for the exposure. This cannot be widened as desired by optical means, since the light intensity required for the exposure otherwise falls too greatly. Connection of several illumination fields alongside one another in film direction is not possible owing to the unavoidable divergence of the rays in the edge region of the illumination fields.

Joining of diffusers in an arc arrangement is technically not only very complicated but also too expensive compared to a continuous process.

The one-stage production process according to the invention now makes it possible for the first time to produce two or more microoptic light guide elements in web form successively alongside one another. To this end, first only a portion of the backing web, for example half the web width, is coated with the photosensitive coating composition and exposed. To this end, preference is given to selecting a backing web on which the liquid photosensitive material wets so well that the layer has a wedge profile at the edge. Once the diffuser has been produced on this partial section of the backing web in the manner described above, the same process is repeated in the next partial section, the seam region preferably being covered in the form of a wedge and the illumination device accordingly being aligned above the new portion by parallel movement.

With suitably selected parameters, it was possible overall to produce approx. 20 meter one-step diffusers, as described in the example.

Of course, the apparatus may also comprise customary devices suitable for transporting, unwinding or winding or guiding webs, such as rolls, rollers, brakes, etc., drive devices, control devices and measurement devices, or such devices as are customary for the transport and the treatment of webs or belts can be mounted on the apparatus. For instance, the roll bearing the backing web can be placed at the start of the apparatus in order to transport the web to the apparatus, and a second roll onto which the product produced is wound is disposed at the end. The roll may optionally also be mounted into the apparatus at points intended therefor.

Longitudinal strips caused by drag on the light guide element to be produced can be prevented by an appropriately adjusted web stress for the backing web during the production process. Particularly good results were achievable when the pressure for the brake of the unwinding stage had been adjusted to about 2 bar. Any crease formation on the mask after the lamination was avoidable through exact matching of the running speed of the embossing calender for the application of the mask by lamination to the web speed of the backing web. In addition, it has been found that even relatively minor shocks to the web, for example contact in the winding stage or with the exposure table, can lead to defects in the layer.

By virtue of the process according to the invention, it is possible to produce diffractive light guide elements as flexible webs, preferably in the form of films, in a continuous roll-to-roll process in one stage. In this process, the backing web is unwound from a roll, transported to a second roll and wound up again there, the web being subjected to the process steps described in succession while being transported thereto. A continuous process requires a constant web speed, i.e. the backing web is transported at uniform speed. Surprisingly, it was possible in accordance with the invention to combine suitable working steps and to carry them out in succession in a continuous run. The web speed can be selected in a suitable manner by the person skilled in the art; the process according to the invention can be carried out, for example, with a web speed in the range from 0.05 to 10 m/min, preferably from 0.1 to 4 m/min. The web speed is relatively low compared to the speeds used conventionally in coating processes, but equivalent and even better coating results are achieved. In the continuous process according to the invention, the web speed for the coating and for the exposure (structuring) is identical.

The light guide elements obtained in accordance with the invention can be combined with one or more different light guide elements by superposing them in the desired layer sequence. The light guide elements can be bonded to one another in a customary manner, for example by adhesion. The other light guide element(s) may each be conventional elements or preferably likewise be produced by the process according to the invention. Such a two-layer or multilayer composite allows particular optical effects to be achieved. If, for example, two asymmetric diffusers (±30° . . . ±50°) are combined, a light guide element with high transmission in the event of perpendicular incidence of light and low transmission in the event of oblique incidence of light is obtained.

By virtue of the process according to the invention, it has been possible to produce microoptical light guide elements which, in contrast to the elements which were obtained by prior art processes, were virtually free of inclusions or bubbles. The webs produced can, if required, be cut into pieces of suitable length. The figure shows the performance of a light guide element produced in the example, with regard to the transmission as a function of the angle, measured at three different positions in transverse direction (right-hand edge, middle, left-hand edge).

The invention is illustrated by the example which follows.

EXAMPLE

1. Photosensitive Coating Composition
Preparation of Zr Complex (Zr/Methacrylic Acid Complex; Zr/MAA)

187.2 g (0.40 mol) of $Zr(OPr)_4$ (82% in butanol) were initially charged in a 500 ml three-neck flask and cooled in an ice bath. To this were slowly added with stirring 34.44 g (0.40 mol) of methacrylic acid. Subsequently, the reaction mixture was warmed to 25° C. and stirred for 15 minutes.
Preparation of Polymer Solution To 1000 g of butyl acetate were added 250 g of PVAc pellets and the mixture was stirred at 80° C. for 16 h. After adding 100 g of Ebecryl® 150 (methacrylate-modified bisphenol A), the mixture was stirred at 25° C. for a further 10 min until the reaction mixture became clear. Subsequently, 150 g of Ultramol M® (adipic ester derivative) were added and the mixture was stirred at 25° C. for 20 min.
Preparation of Coating Solution Thereafter, 22.27 g of the Zr/MAA prepared were added slowly with stirring to the polymer solution. On completion of addition, the mixture was stirred at 25° C. for 10 min. After stirring, 0.31% of Irgacure® 651 as a photoinitiator was added.

2. Mask

The mask was produced a few hours before the diffuser production. To this end, a mask suspension (AM315) with a graphite content of 2.8% in the solid at a total solids content of 6.3% was used. The backing film used to produce the mask was Melinex® 400 with a thickness of 75 μm and a width of 356 mm. The application was effected with a conventional knifecoating fountain and doctor knife with a gap of 200 μm. At a web speed of 1 m/min and an oven temperature of 150° C., the film coated with the suspension was dried in order to produce the flexible mask.

3. Backing Web

The backing web used was Melinex® 400 film with a thickness of 50 μm and a width of 540 mm. This film bears an antiblocking pretreatment on the outside. The coating composition was applied on the untreated inside of the substrate film.

4. Web Route

The web route is divided into four areas.

a) The application of the coating composition and the drying of the layer in the oven. The sol was applied manually with a knifecoating fountain and a doctor knife. In the subsequent run through a forced-air oven, the applied layer was dried.

b) In the next area, the lamination was effected. A roll system presses the film with the mask onto the dried photonanomer layer. The mask remains adhering on the photonanomer. The mask film is transported away by the roller system.

c) The third area is the exposure stage. To cure the laminated layers, two UV lamps from Lot Oriel are available. During the first exposure, the film is conducted over a heated table and simultaneously exposed.

d) The second exposure is effected from the back, in order to cure any regions which have not been curable completely beforehand. This exposure step is referred to as the flood cure. In the last area, the mask was also delaminated. For this purpose, the mask was pulled off by hand.

5. Procedure

The table which follows specifies parameters for the unwinding and the master roll:

| No. | Name | Value |
|---|---|---|
| 1 | Film side coated | Inside |
| 2 | Pressure of the unwinder brake | 2 bar |
| 3 | Corona power | Off |
| 4 | Ionization bar yes/no | Off |
| 5 | Pressure of the pressing roller | Off |
| 6 | Web speed | 0.31 m/min |

The pressure of the brake (No. 2) of 2 bar listed is relatively high, in order that the strip tension of the master roll is sufficiently great to prevent leakage of the sol from the knifecoating fountain. Normally, the braking action required for this purpose is applied by pressing the film onto the master roll with a rubber roll. Owing to the very high draw tension, this can lead to creases being introduced in this clamping means. Use of a thicker backing web (for example 75 μm) can prevent this.

The table which follows lists the knifecoating parameters.

| No. | Name | Value |
|---|---|---|
| 7 | Doctor knife used | New |
| 8 | Doctor knife gap | 160 μm |
| 9 | Knifecoating fountain used | 5 |
| 10 | Knifecoating fountain gap | 1 mm |
| 11 | Filling method | Manual |
| 12 | Amount of coating used | 250 ml |

The knifecoating fountain used had a width of 26 cm. For long coating runs, the sol can be metered in continuously from a reservoir vessel, for example a dropping funnel.

The following table shows the oven parameters used.

| No. | Name | Value |
|---|---|---|
| 13 | Oven flap 1 | 9 |
| 14 | Oven flap 2 | 8 |
| 15 | Oven flap 3 | 8 |
| 16 | Oven flap 4 | 7 |
| 17 | Oven temperature | 80° C. |
| 18 | Forced air rate | 6.3 m/s |

The oven flaps listed (positions 13-16) regulate the flow of the forced air within the oven. Two of the flaps are responsible for the air intake; the two others serve for air distribution.

The following table lists parameters for the lamination.

| No. | Name | Value |
|---|---|---|
| 19 | Embossing calender setting | Factor 2.1 |
| 20 | Embossing calender display | 0.31 m/min |

The setting of the embossing calender is a semi-quantitative measure of whether the embossing calender is, if anything, additionally pulling or braking on the film web. The following table shows parameters for the exposure.

| No. | Name | Value |
|---|---|---|
| 21 | Table temperature | 80° C. |
| 22 | Table inclination | 0° |
| 23 | Operating hours | — |
| 24 | Power setting of the lamp | 1000 W |

The table temperature is controlled with water-filled chambers which are integrated into the table. A possible inclination of the table enables the profile of the diffuser to be varied. The following table reproduces parameters for the flood cure.

| No. | Name | Value |
|---|---|---|
| 27 | Operating hours for flood cure | 3357 |
| 28 | Power setting for flood cure | 1000 W |

The table which follows lists parameters for the lamination and winding.

| No. | Name | Value |
|---|---|---|
| 30 | Winding tension | 200 N |
| 31 | Internal diameter of core for winding | 76 mm |
| 32 | Winding direction | Coating on the outside |

A winding tension of 200 N is selected at such a high level in order that the strip tension in the master roll is sufficiently great and leakage from the knifecoating vessel is prevented.

6. Resulting Diffuser

The production process results in a 50 μm-thick diffuser on Melinex 400 film. The diffuser with a width of 36 cm and length 20 m has a direct transmission of 8.3% at −30°, 7.5% and 30°, approx. 1% at −10° and 10°. In the figure, the direct transmission of the PN-LLE is shown as a function of the angle of incidence in the range of −30° to 30°. The direct transmission ($T_{direct}$) is determined as follows:

$$T_{direct} = (haze/100) \cdot T_{total} \, [\%]$$

What is claimed is:

1. A process for producing a diffractive light guide element, wherein the process comprises, in the sequence indicated:

(a) applying a photosensitive coating composition to a flexible backing web, (b) drying the applied coating composition of (a),
(c) laminating a flexible mask onto the dried coating composition of (b),
(d) exposing the dried coating composition with a mask laminated thereon of (c) through the mask, thereby obtaining a refractive index gradient in the coating composition through pattern exposure,
(e) whole surface curing of the coating composition obtained in (d), thereby fixing the refractive index gradient,
(a) to (e) being performed in a continuous, single-stage roll-to-roll process, and wherein the photosensitive coating composition comprises a photopolymerizable component which is a mono- or polynuclear metal complex with a ligand having a photochemically polymerizable group.

2. The process of claim 1, wherein the mask laminated in (c) is removed after (d) and before or after (e).

3. The process of claim 1, wherein the backing web comprises at least one of a transparent or nontransparent plastic sheet, a metal foil, and a metallized sheet.

4. The process of claim 1, wherein the mask comprises a mask film on a backing film.

5. The process of claim 4, wherein the backing film of the mask is detached after (c), thereby leaving behind the mask film on the coating composition.

6. The process of claim 1, wherein in the course of exposure in (d) the coating composition is subjected to heating.

7. The process of claim 1, which further comprises detaching the backing film from the cured coating composition.

8. The process of claim 1, wherein in (a) the coating composition is applied onto only a part of a width of the backing web, whereby the light guide element is formed only on a partial section of the backing web.

9. The process of claim 8, wherein steps (a) through (e) are repeated at least once on the same backing web and, in the subsequent run(s), the coating composition is applied in (a) in each case to an uncoated part of a width of the backing web.

10. The process of claim 9, wherein, in the subsequent run(s), the coating composition is applied in each case such that partial sections of the light guide element formed adjoin one another.

11. The process of claim 10, wherein the coating composition wets the backing web sufficiently well that a layer of the coating composition applied in one run has a wedge profile at an edge, and, in a next run or a subsequent run, the coating composition is applied such that a seam region to a partial section of the light guide element applied beforehand is overlaid in a wedge shape.

12. The process of claim 1, wherein the coating composition is applied to the flexible backing web by at least one of spiral coating, knife coating, and a casting process.

13. The process of claim 1, wherein a width of the light guide element is more than 60 cm.

14. The process of claim 1, which further comprises cutting a web of the light guide element produced to a suitable length.

15. The process of claim 1, wherein the process further comprises combining a resulting light guide element with one or more other light guide elements by superposition, thereby obtaining a two-layer or multilayer composite.

16. The process of claim 1, wherein the photopolymerizable component comprises at least one component selected from Ti-, Zr-, Nb- and Ta-containing components.

17. The process of claim 1, wherein the photopolymerizable component comprises a Ti-containing component.

18. The process of claim 1, wherein the photopolymerizable component comprises a Zr-containing component.

19. The process of claim 1, wherein the photopolymerizable component comprises a Nb-containing component.

20. The process of claim 1, wherein the photopolymerizable component comprises Ta-containing component.

21. The process of claim 1, wherein the photopolymerizable group comprises a vinyl group.

22. The process of claim 1, wherein the photopolymerizable group comprises at least one of an acryloyl group and a methacryloyl group.

23. The process of claim 16, wherein the photopolymerizable group comprises at least one of a vinyl group, an acryloyl group, and a methacryloyl group.

\* \* \* \* \*